US010074330B2

(12) United States Patent
Tseng et al.

(10) Patent No.: US 10,074,330 B2
(45) Date of Patent: Sep. 11, 2018

(54) SCAN DRIVER AND DISPLAY PANEL USING THE SAME

(71) Applicant: Innolux Corporation, Miao-Li County (TW)

(72) Inventors: Ming-Chun Tseng, Miao-Li County (TW); Chun-Yu Chen, Miao-Li County (TW); Hung-Lin Hsu, Miao-Li County (TW); Chien-Hsiang Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 397 days.

(21) Appl. No.: 14/921,000

(22) Filed: Oct. 23, 2015

(65) Prior Publication Data
US 2016/0148556 A1 May 26, 2016

(30) Foreign Application Priority Data
Nov. 26, 2014 (TW) .............................. 103140942 A

(51) Int. Cl.
G09G 3/20 (2006.01)
G09G 3/36 (2006.01)
G11C 19/28 (2006.01)

(52) U.S. Cl.
CPC ... G09G 3/3677 (2013.01); *G09G 2300/0408* (2013.01); *G09G 2310/0218* (2013.01);
(Continued)

(58) Field of Classification Search
CPC ......... G09G 3/3677; G09G 2310/0218; G09G 2310/0267; G09G 2300/0408; G09G 2310/0286; G11C 19/287
See application file for complete search history.

(56) References Cited

U.S. PATENT DOCUMENTS 5,536,932 A 7/1996 Hack et al.
6,396,468 B2 5/2002 Matsushima et al.
(Continued)

FOREIGN PATENT DOCUMENTS

TW 200830247 A 7/2008

OTHER PUBLICATIONS

TIPO Office Action dated Jan. 15, 2016 in corresponding Taiwan application (No. 103140942).

*Primary Examiner* — Nelson Rosario
*Assistant Examiner* — Andrew Lee
(74) *Attorney, Agent, or Firm* — McClure, Qualey & Rodack, LLP

(57) ABSTRACT

The present invention provides a scan driver and a display using the same. The scan driver includes multiple stages of driving units. The driving units are controlled by a start signal, a clock signal and at least one selection signal. The $i^{th}$ stage of the driving unit includes a shift register and a de-multiplexer. The shift register generates a scan signal according to the clock signal and a trigger signal. The de-multiplexer selectively outputs the scan signal to multiple scan lines according to the at least one selection signal. The trigger signal of the $1^{st}$ stage of the driving unit is the start signal, and the trigger signal of the $(i+1)^{th}$ stage of the driving unit is the scan signal of the $i^{th}$ stage of the driving unit.

9 Claims, 13 Drawing Sheets

(52) U.S. Cl.
CPC ............... *G09G 2310/0267* (2013.01); *G09G 2310/0286* (2013.01); *G11C 19/287* (2013.01)

(56) References Cited

U.S. PATENT DOCUMENTS

| | | | |
|---|---|---|---|
| 7,483,005 B2 | 1/2009 | Nakamura et al. | |
| 7,573,452 B2 | 8/2009 | Nathan et al. | |
| 8,669,974 B2 | 3/2014 | Yang et al. | |
| 2005/0243588 A1 | 11/2005 | Kubota et al. | |
| 2007/0001990 A1* | 1/2007 | Lee | G09G 3/3677 345/100 |
| 2008/0165112 A1 | 7/2008 | Su | |
| 2009/0073104 A1* | 3/2009 | Lu | G09G 3/2096 345/99 |
| 2013/0328612 A1* | 12/2013 | Ofuji | H03K 17/005 327/408 |
| 2015/0160766 A1* | 6/2015 | Park | G09G 3/3674 345/173 |

* cited by examiner

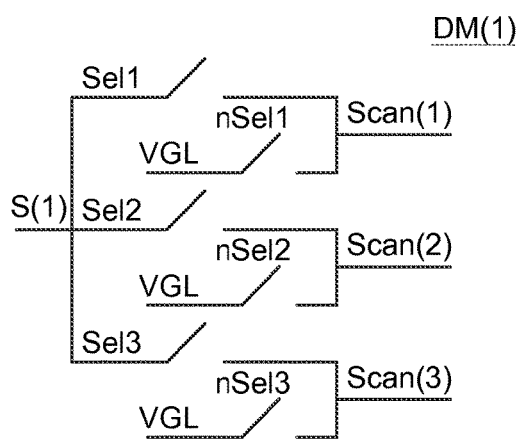
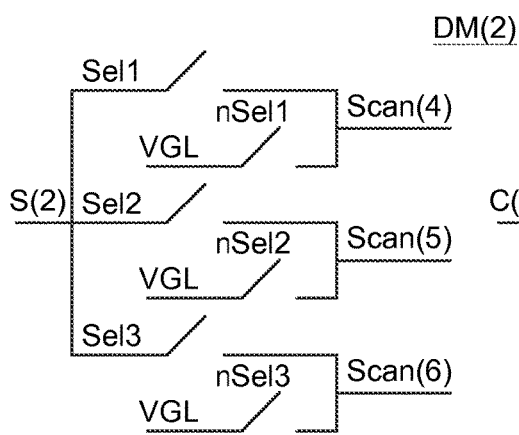
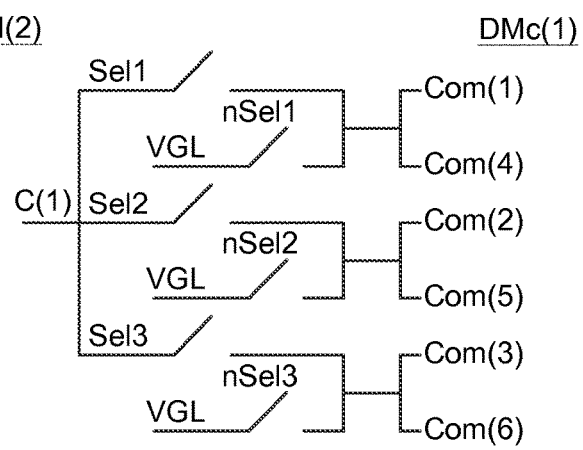
FIG. 10A     FIG. 10B

SCAN DRIVER AND DISPLAY PANEL USING THE SAME

This application claims the benefit of Taiwan application Serial No. 103140942, filed Nov. 26, 2014, the subject matter of which is incorporated herein by reference.

BACKGROUND

Field of the Invention

The disclosure relates in general to a scan driver and a display panel using the same, and more particularly to a scan driver utilizing de-multiplexers.

Related Art

Display panel has been widely used in a variety of electronic devices in modern technology, such as cellular phone, television, personal computer, and so on. In order to fulfill the high resolution requirement of the display panel, information of the entire image frame may be written to the display panel by a scan driver and a data driver. To reduce the hardware cost resulting from an external printed circuit board (PCB), thin film transistors (TFT) on the display panel may be utilized for the scan driver. When the TFT array is being manufactured, part of the scan driver is formed on the substrate of the display panel as well. This technique is called gate on panel (GOP). By using the GOP technique, design complexity of an external driving circuit can be reduced, and production cost of the display panel can also be reduced. Since the scan driver plays an important role in the display panel, the benefit of reducing the hardware area of the scan driver is important.

SUMMARY

The disclosure is directed to a scan driver and a display panel using the same, and more particularly to a scan driver utilizing de-multiplexers.

According to one aspect of the invention, a scan driver is provided. The scan driver includes multiple stages of first driving units. The first driving units are controlled by a first start signal, a clock signal and at least one selection signal. The $i^{th}$ stage of the driving unit includes a shift register and a de-multiplexer. The shift register generates a scan signal according to the clock signal and a trigger signal. The de-multiplexer selectively outputs the scan signal to multiple scan lines according to the at least one selection signal. The trigger signal of the $1^{st}$ stage of the first driving unit is the first start signal, and the trigger signal of the $(i+1)^{th}$ stage of the first driving unit is the scan signal of the $i^{th}$ stage of the first driving unit.

According to another aspect of the invention, a display panel is provided. The display panel includes a thin film transistor array substrate, a first display region, and a scan driver. The first display region includes multiple first row pixel circuits. The scan driver includes multiple stages of first driving units. The first driving units are controlled by a first start signal, a clock signal and at least one selection signal. The $i^{th}$ stage of the driving unit includes a shift register and a de-multiplexer. The shift register generates a scan signal according to the clock signal and a trigger signal. The de-multiplexer selectively outputs the scan signal to multiple scan lines according to the at least one selection signal. The trigger signal of the $1^{st}$ stage of the first driving unit is the first start signal, and the trigger signal of the $(i+1)^{th}$ stage of the first driving unit is the scan signal of the $i^{th}$ stage of the first driving unit.

The invention will become apparent from the following detailed description of the preferred but non-limiting embodiments. The following description is made with reference to the accompanying drawings.

BRIEF DESCRIPTION OF THE DRAWINGS

FIG. 10A and FIG. 10B show diagrams of de-multiplexers in the display panel according to the fourth embodiment of the invention.

Figure 1A:
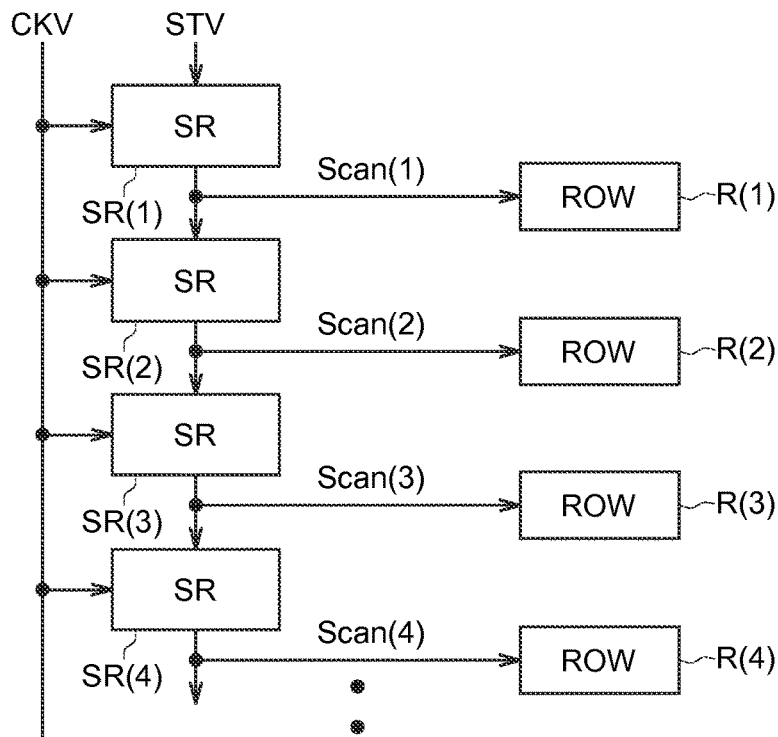
FIG. 1A shows a diagram of a conventional display panel.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
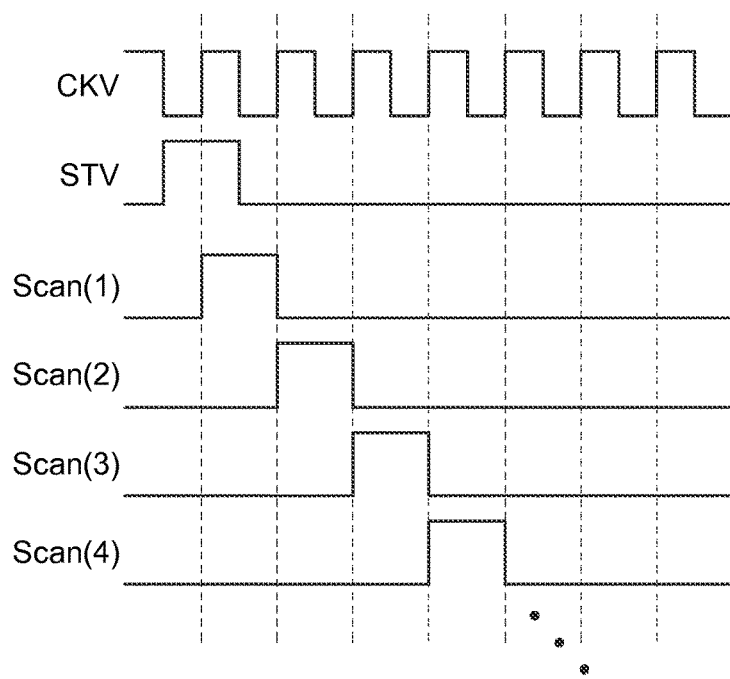
FIG. 1B shows a timing diagram regarding signals of the conventional display panel.

Please refer to FIG. 1A and FIG. 1B. FIG. 1A shows a diagram of a conventional display panel 1. FIG. 1B shows a timing diagram regarding signals of the conventional display panel 1. The display panel 1 includes M row pixel circuits (abbreviated as ROW in FIG. 1) R(1)-R(M). For example, for a display panel 1 with image resolution 1280× 960, M equals 960. The scan driver of the display panel 1 includes M shift registers (abbreviated as SR in FIG. 1) SR(1)-SR(M). M shift registers are controlled by the same clock signal CKV. The first stage of the shift register SR(1) receives the start signal STV to determine the time at which the scanning procedure starts. Because M shift registers are cascade connected, the pulse of the start signal STV shifts downward to the next stage when the positive edge of the clock signal CKV occurs. Please refer to the scan signals Scan(1)-Scan(4) outputted from the shift registers SR(1)-SR (4) respectively. The scan signal Scan(i) drives the row pixel circuit R(i) such that the $i^{th}$ row of the display panel 1 is written by image data driven by a data driver (not shown in FIG. 1A for simplicity reason). As shown in FIG. 1B, image data is written by scanning rows progressively, After completing scanning M rows for an image frame, the start signal STV is triggered again to restart the scanning procedure.

As for the scan driver shown in FIG. 1A, one shift register is required for each row pixel circuit. These shift registers may be inside a gate driver integrated circuit (IC) or be formed on the TFT array substrate of the display panel 1 by the GOP technique. The circuit layout area of the scan driver according to the structure shown in FIG. 1A may be too large for applications. A scan driver that is capable of reducing circuit layout area is provided in the following embodiments.

Figure 2:
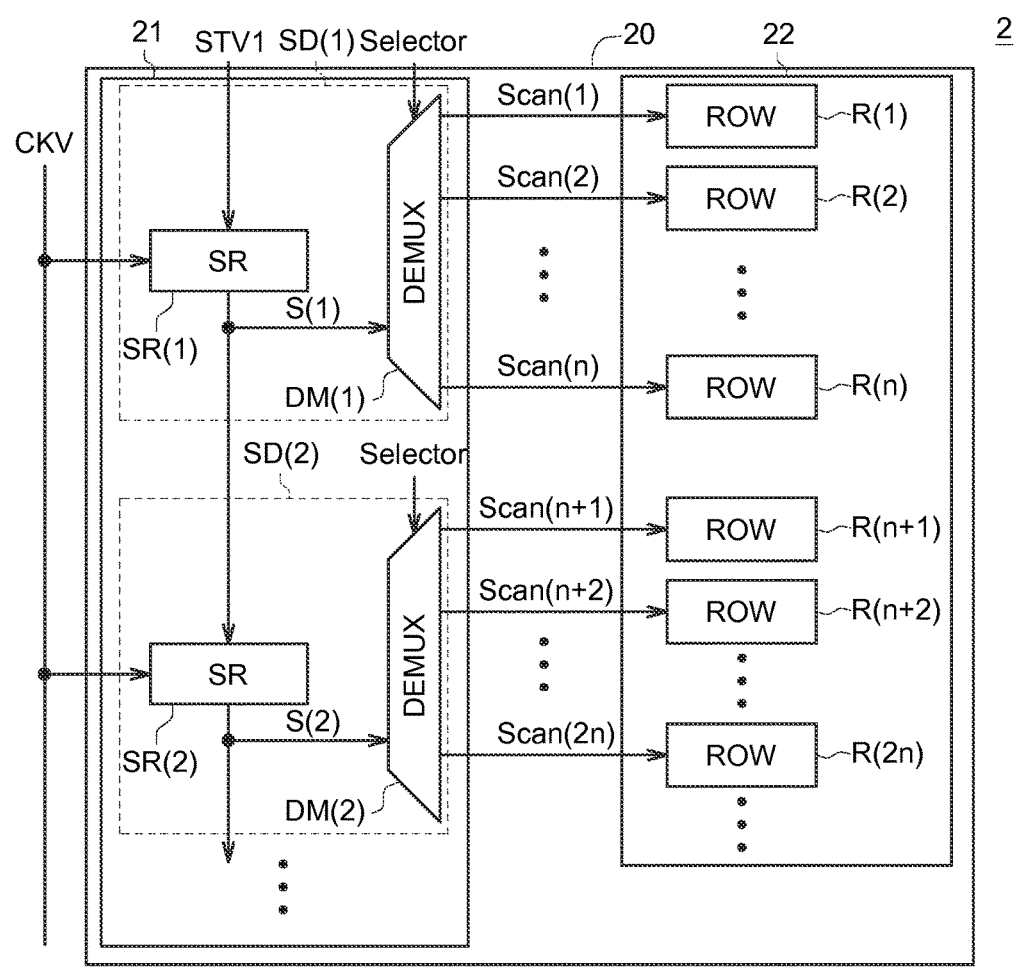
FIG. 2 shows a diagram of a display panel according to the first embodiment of the invention.

FIG. 2 shows a diagram of a display panel 2 according to the first embodiment of the invention. The display panel 2 includes a TFT array substrate 20, a scan driver 21, and a first display region 22. The first display region 22 is formed on the TFT array substrate 20. The first display region 22 includes multiple first row pixel circuits R(1), R(2), and so on. The scan driver 21 is formed on the TFT array substrate 20. The scan driver 21 includes multiple stages of first driving units SD(1), SD(2), and so on. The first driving units 21 are controlled by a first start signal STV1, a clock signal CKV and at least one selection signal Selector. The $i^{th}$ stage of the driving unit SD(i) includes a shift register SR(i) and a de-multiplexer DM(i). The shift register SR(i) generates a scan signal S(i) according to the clock signal CKV and a trigger signal. The de-multiplexer DM(i) selectively outputs the scan signal S(i) to multiple scan lines Scan(n*i−n+1)-Scan(n*i) according to the at least one selection signal Selector. Each scan line Scan(x) is configured to drive one of the first row pixel circuits R(x). The trigger signal of the $1^{st}$ stage of the first driving unit SD(1) is the first start signal STV1, and the trigger signal of the $(i+1)^{th}$ stage of the first driving unit SD(i+1) is the scan signal S(i) of the $i^{th}$ stage of the first driving unit SD(i), with i being a positive integer greater than or equal to 1.

In one embodiment, the scan driver 21 may be implemented by TFT with the GOP technique. The shift registers and de-multiplexers of the scan driver 21 may be partially or totally formed on the TFT array substrate 20. For example, the shift registers are formed in the driver IC and the de-multiplexers are formed on the TFT substrate 20. Alternatively the scan driver 21 may also be disposed in a gate driver IC. The signals received by the scan driver 21, including the clock signal CKV, the first start signal STV1, and the selection signal Selector, may come from a printed circuit board external to the TFT array substrate 20. For example, these signals may be provided by a driver IC.

Take the first stage of the first scan driver SD(1) for example. The first stage of the first scan driver SD(1) may utilize one shift register SR(1) and one de-multiplexer DM(1) to generate signals for driving n scan lines Scan(1)-Scan(n). The n scan lines Scan(1)-Scan(n) may be configured to drive n row pixel circuits R(1)-R(n). The de-multiplexer DM(1) selectively outputs the scan signal S(1) to the scan lines Scan(1)-Scan(n) according to at least one selection signal Selector. For example, when n=4 and the selection signal Selector selects the second scan line, the de-multiplexer DM(1) may output the scan signal S(1) to the scan line Scan(2), and output a cutoff voltage VGL to the other scan lines Scan(1), Scan(3), and Scan(4). Image date can thus be written to the row pixel circuit R(2). The other row pixel circuits R(1), R(3), and R(4) are kept in the cutoff state and thus image data would not be written to these row pixel circuits.

Figure 3:
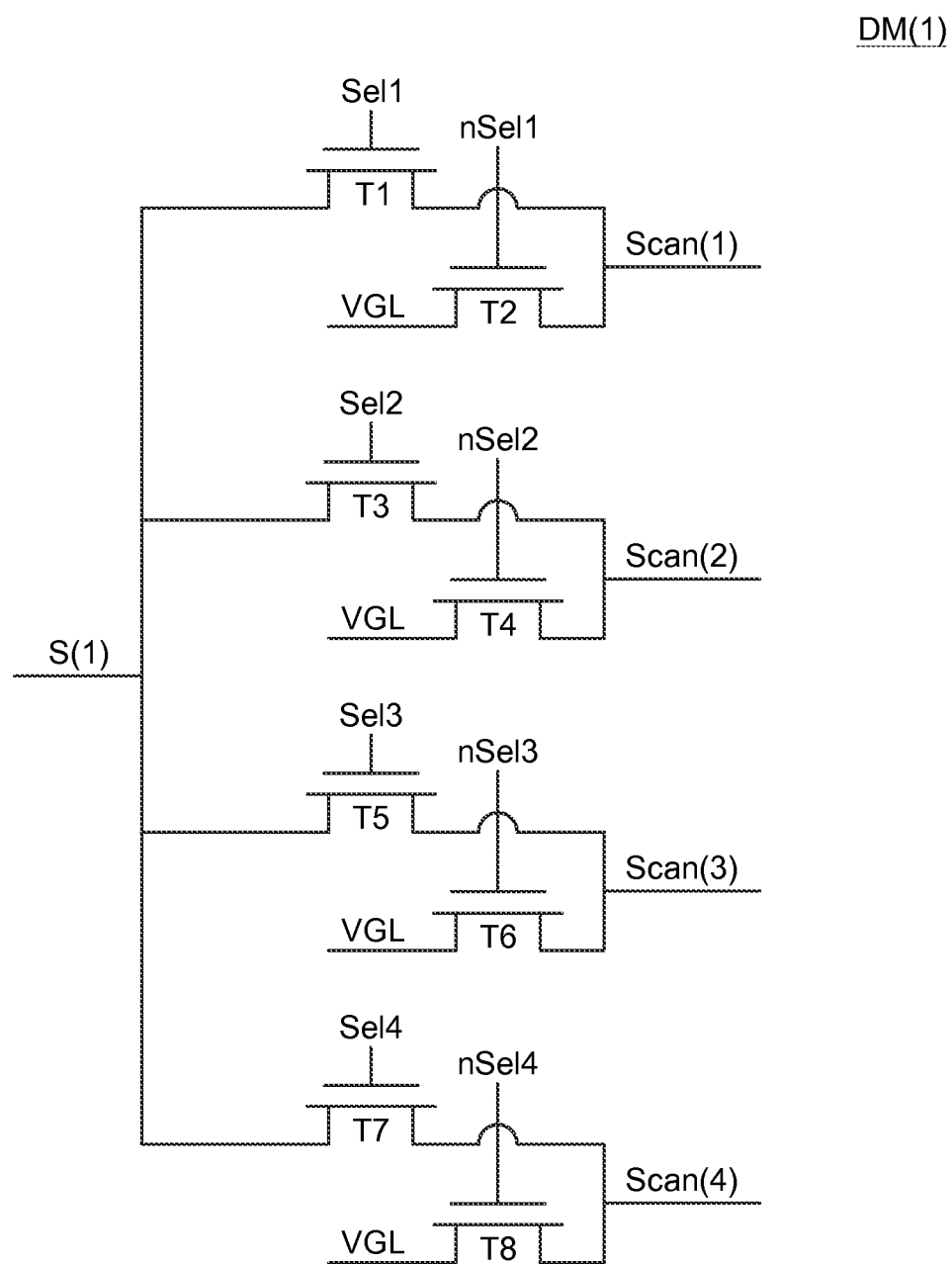
FIG. 3 shows a diagram of a de-multiplexer in the display panel according to the first embodiment of the invention.

FIG. 3 shows a circuit structure of one implementation of the de-multiplexer DM(1) in the display panel 2 according to the first embodiment of the invention. In this example a 1-to-4 de-multiplexer is adopted (n=4). The de-multiplexer DM(1) includes 8 TFTs T1-T8. The de-multiplexer DM(1) selectively outputs either the scan signal S(1) or the cutoff voltage VGL to each scan line respectively according to 8 selection signals Sel1, nSel1, Sel2, nSel2, Sel3, nSel3, Sel4, nSel4. The selection signal nSel1 is the inverse of the selection signal Sel1, and the relationships between other pairs of the selection signals are alike. When the selection signal Sel1 is at logic high level, the scan line Scan(1) outputs the scan signal S(1). On the other hand, when the selection signal Sel1 is at logic low level, the scan line Scan(1) outputs the cutoff voltage VGL. As shown in FIG. 3, each scan line can be controlled individually. In other words, each scan line is independent. The cutoff voltage VGL may be outputted to all the scan lines simultaneously. Therefore, a designer may accomplish a desired control function by designing an external control circuit to generate appropriate control signals Sel1, nSel1, Sel2, nSel2, Sel3, nSel3, Sel4, nSel4.

The number of the selection signal Selector is related to the number of scan lines n outputted from the first driving unit SD(1). As the number of scan lines n increase, the number of the selection signal Selector increases as well so as to select between n scan lines. FIG. 3 shows an example implementation of the de-multiplexer DM(1), while the invention is not limited thereto. For a 1-to-4 de-multiplexer, the number of the selection signal may be for example 2, 4, or 8, depending on the desired function of the de-multiplexer and other design constraints.

Please refer to FIG. 2, the first stage of the first driving unit SD(1) generates driving signals for n scan lines Scan(1)-Scan(n). The second stage of the first driving unit SD(2) generates driving signals for n scan lines Scan(n+1)-Scan(2n). The number of scan lines outputted from each stage of the first driving unit may also be different. As the number of stages of the first driving unit increases, if the number of scan lines outputted from each stage is equal, the hardware routing design may be easier and the timing control may also be simpler. In one embodiment, the number of scan lines output from each stage of the first driving unit equals n. For a scan driver 21 generating driving signals for M scan lines, there are (M/n) stages of the first driving unit SD(i). Hence only (M/n) shift register SR(i) are required.

The shift register SR(1) in the first stage of the first driving unit SD(1) is cascade connected to the shift register SR(2) in the second stage of the first driving unit SD(2). Similarly, the shift register SR(2) in the second stage of the first driving unit SD(2) is cascade connected to the shift register SR(3) in the third stage of the first driving unit SD(3). In other words, the trigger signal of the first stage of the first driving unit SD(1) is the first start signal STV1. The trigger signal of the $(i+1)^{th}$ stage of the first driving unit SD(i+1) is the scan signal S(i) of the $i^{th}$ stage of the first driving unit SD(i).

Figure 4A:
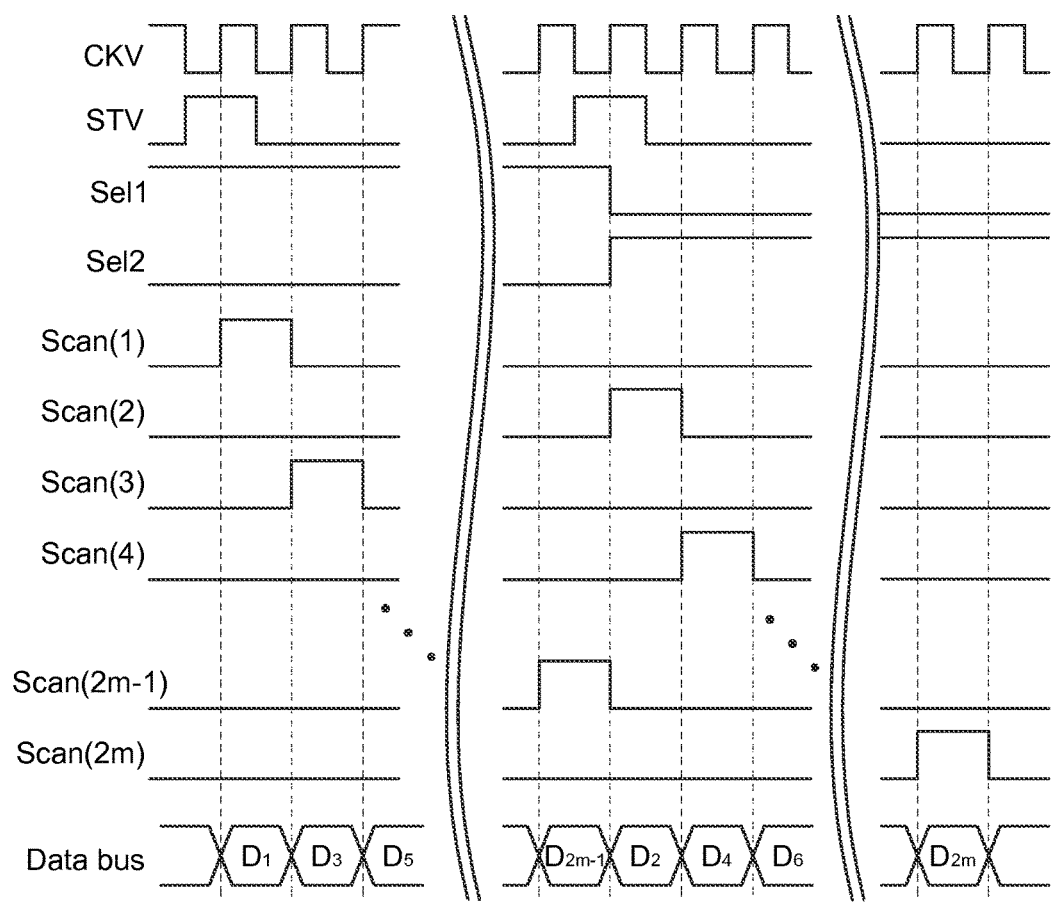
FIG. 4A shows a timing diagram regarding signals of the display panel according to the first embodiment of the invention.

FIG. 4A shows a timing diagram regarding signals of the display panel 2 according to the first embodiment of the invention. n is set to 2 in the example shown in FIG. 4A in order to simplify the diagram for a better understanding of the operation. Each first driving unit SD(i) utilizes a 1-to-2 de-multiplexer DM(i). The selection signal Selector includes Sel1, Sel2, nSel1, nSel2. There are 2m row pixel circuits R(1)-R(2m) in the first display region 22. The scan driver 21 includes m stages of the first driving unit SD(1)-SD(m).

Because a 1-to-2 de-multiplexer DM(i) is utilized, the writing procedure for an image frame may be divided into two phases. In the first phase (Phase 1), the selection signal Sel1 is kept logic high while the selection signal Sel2 is kept logic low. Therefore each de-multiplexer DM(i) is controlled to output the scan signal S(i) to its first output terminal. As shown in FIG. 4A, after triggering the first start signal STV1, the scan lines Scan(1), Scan(3), Scan(5), . . . , Scan(2m−1) are triggered in a sequential order by the cascaded shift registers SR(1)-SR(m). When these scan lines are triggered, a data driver outputs the corresponding image data $D_1$, $D_3$, $D_5$, . . . , $D_{2m-1}$ to the data bus.

In the second phase (Phase 2), the selection signal Sel1 is kept logic low while the selection signal Sel2 is kept logic high. Each de-multiplexer DM(i) is controlled to output the scan signal S(i) to its second output terminal. The first start signal STV1 is triggered again, the scan lines Scan(2), Scan(4), Scan(6), . . . , Scan(2m) are triggered sequentially by the cascaded shift registers SR(1)-SR(m). When these scan lines are triggered, the data driver outputs the corresponding image data $D_2$, $D_4$, $D_5$, . . . , $D_{2m}$ to the data bus.

In the above example, the scan lines Scan(1), Scan(2), . . . , Scan(2m) are configured to drive the $1^{st}$, $2^{nd}$, . . . , $(2m)^{th}$ row of the display panel 2. Therefore according to the scan driver 21 in the first embodiment, the image data is first written to the odd rows and then written to the even rows of the display panel 2.

Figure 5:
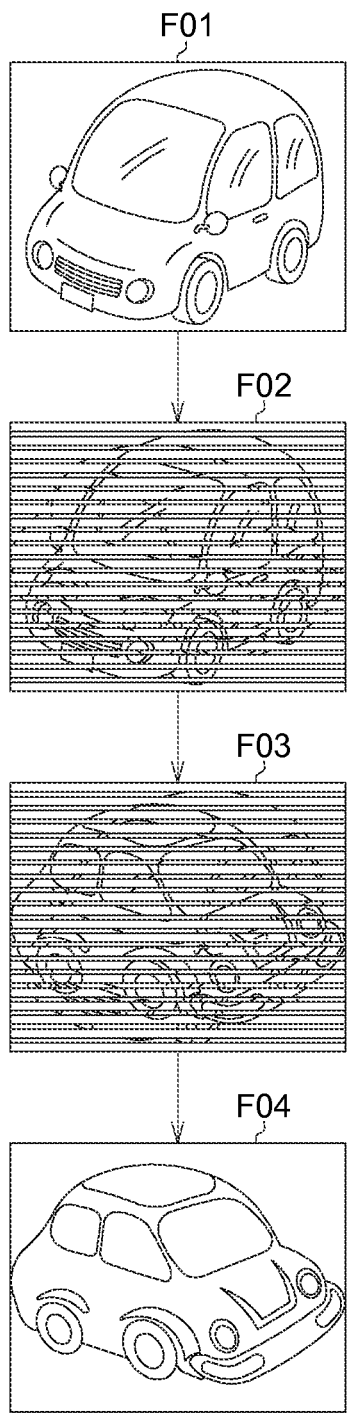
FIG. 5 shows a diagram of writing image data according to the first embodiment of the invention.

FIG. 5 shows a diagram of writing image data according to the first embodiment of the invention. n is set to 3 in the example shown in FIG. 5 for a better understanding of the operation of writing image data. The frame F01 is a previous frame in which a car is toward the left. The frame F04 is a current frame in which a car is toward the right. The whole writing procedure of the current frame F04 may be divided into 3 phases because n=3 in this example. In Phase 1, the $1^{st}$, $4^{th}$ $7^{th}$, . . . rows are scanned sequentially (frame F02). In Phase 2, the $2^{nd}$, $5^{th}$, $8^{th}$, . . . rows are scanned sequentially (frame F03). In Phase 3, the $3^{rd}$, $6^{th}$ 9th, . . . rows are scanned sequentially (frame F04). The first start signal STV1 is trigged three times to complete writing an image frame.

Figure 4B:
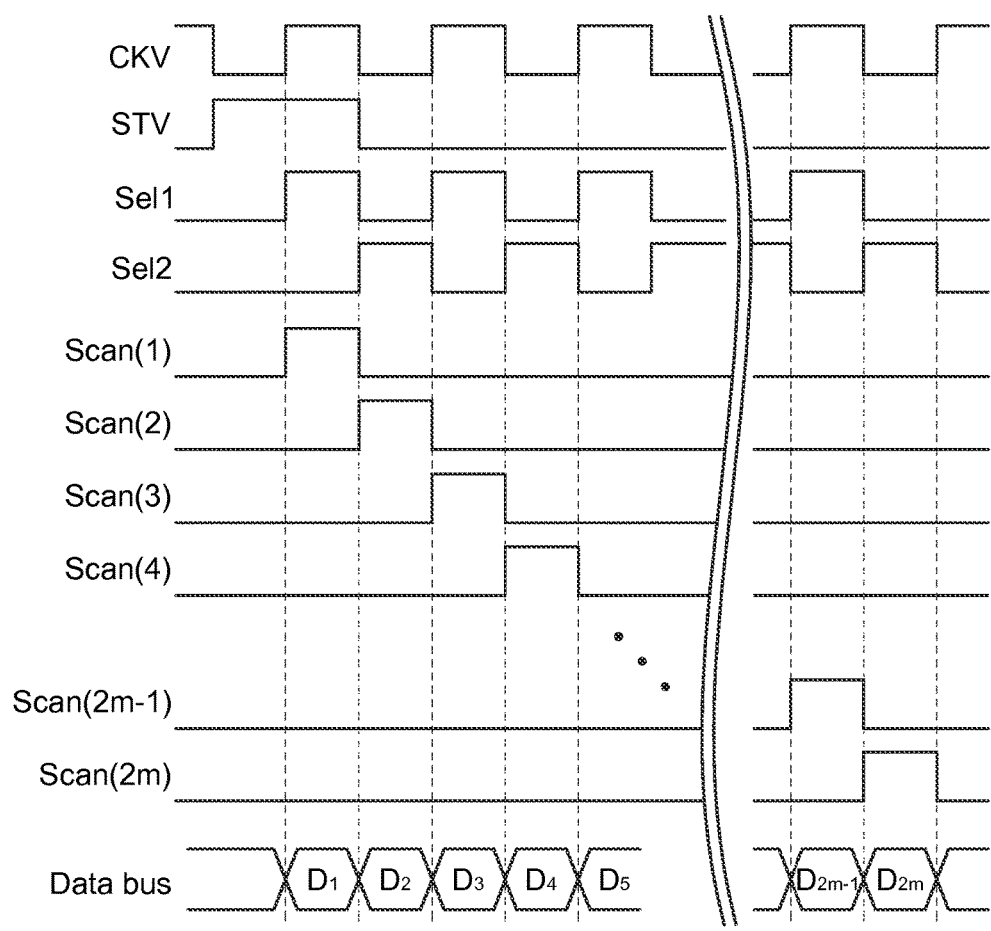
FIG. 4B shows a timing diagram of scanning rows progressively.

Note that the present invention is not limited to the interleaved row scanning as described above. The scanning method can be changed based on different control signal or different routing method. For example, the scanning method may be changed to progressive row scanning. Take n=2 for example, there are 2m scan lines in the display panel 2. Two possible implementation methods are described here. The first one is to connect the output of the first stage of the de-multiplexer DM(1) to the scan lines Scan(1) and Scan (m+1) of the display panel 2, connect the output of the second stage of the de-multiplexer DM(2) to the scan lines Scan(2) and Scan(m+2) of the display panel 2, and so on. The order of the image data being written thus becomes $D_1$, $D_2$, $D_3$, $D_4$, . . . , $D_{2m}$. The second implementation method is to change the selection signal Selector. Please refer to FIG. 4B showing a timing diagram of scanning rows progressively. The frequencies of the selection signals Sel1 and Sel2 are the same as the frequency of the clock signal CKV. Moreover, the selection signal Sel1 is out-of-phase (with phase difference equal to 180°) to the selection signal Sel2. Thus in one cycle of the clock signal CKV, the first stage of the first driving unit SD(1) sequentially scans the scan lines Scan(1) and Scan(2). In the next cycle of the clock signal CKV, the second stage of the first driving unit SD(2) sequentially scans the scan lines Scan(3) and Scan(4). The order of the image data being written thus becomes $D_1$, $D_2$, $D_3$, $D_4$, . . . , $D_{2m}$. In the second implementation method, the frame rate can be kept the same by adjusting the frequency of the clock signal CKV via an external control signal.

In the first implementation method, hardware routing has to be modified. When m value is large, the output terminals of a de-multiplexer are connected to two scan lines separated far away from each other, which may be difficult in real routing consideration. In the second implementation method, the selection signal is toggled with a high frequency, which results in additional power consumption. Thus although there may be different connection relationships or different control methods, the description given below in this disclosure follows the first embodiment, which scans the rows separated by n sequentially.

Figure 12:
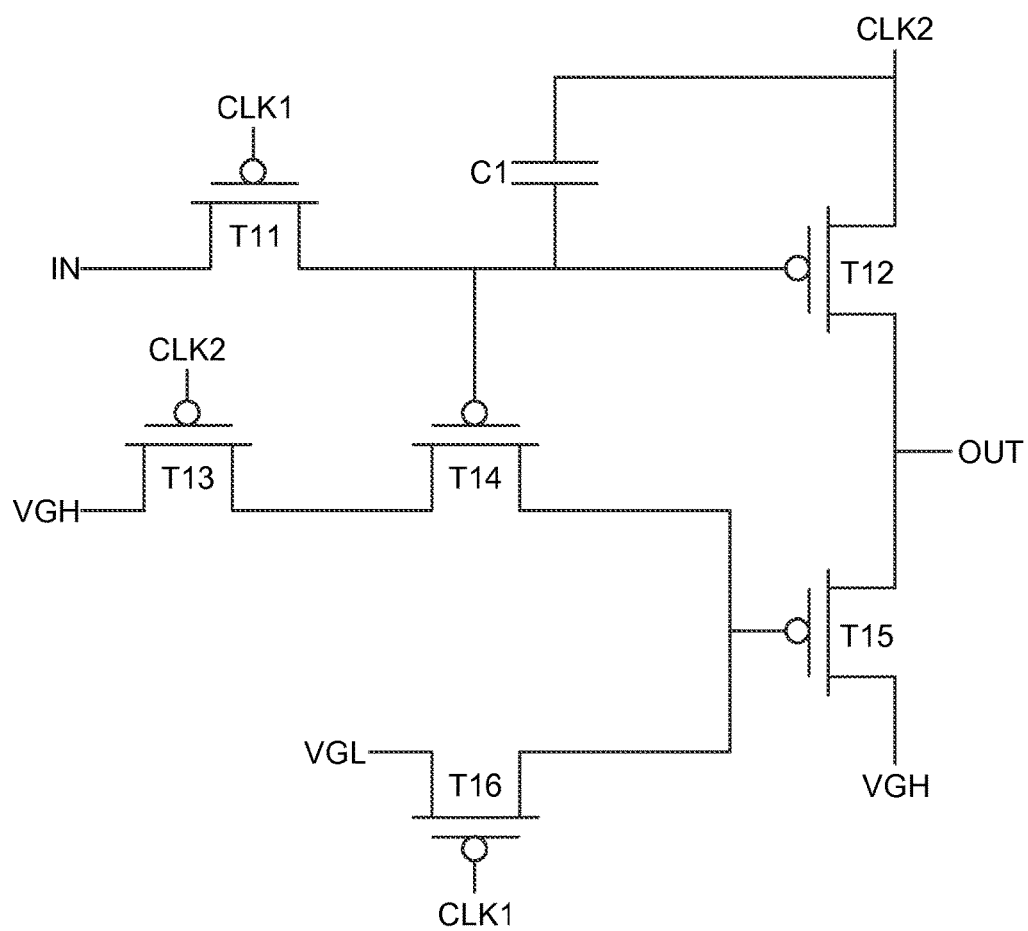
FIG. 12 shows an example circuit schematic of a shift register.

Because the scan driver as described above adopts one shift register and one de-multiplexer as a first driving unit to drive multiple scan lines, the number of TFTs used can be reduced and thus the area of the scan driver can be reduced. An example circuit schematic of a shift register is shown in FIG. 12. It can be estimated that one shift register uses 7 TFTs. According to the architecture shown in FIG. 1A, four shift registers, hence 28 TFTs are required for four scan lines. In contrast, according to the architecture shown in FIG. 2A (n=4 for example), one shift register (7 TFTs) and one de-multiplexer (8 TFTs, as shown in FIG. 3) are required for four scan lines. Therefore 15 TFTs are needed in total. Take hardware wiring width into consideration, the area cost can be estimated as listed in Table 1 below. When adopting low temperature poly-silicon (LTPS) TFT, the area of the scan driver can be reduced to 83%. When adopting indium gallium zinc oxide (IGZO) TFT, the area of the scan driver can be further reduced to 70% because the area of one IGZO TFT is larger than that of one LTPS TFT.

TABLE 1

|  | The number of TFTs (Every four scan lines) | | | Area | |
| --- | --- | --- | --- | --- | --- |
|  | SR | DEMUX | Total | LTPS | IGZO |
| FIG. 1A | 28 | 0 | 28 | 100% | 100% |
| FIG. 2 | 7 | 8 | 15 | 83% | 70% |

The reduced area of the GOP scan driver facilitates a narrow bezel panel design, which provides better visual experience for users. In addition, the reduced area also results in a reduction in the size and cost of the gate driver IC. Furthermore, as described above, the selection signal Selector in each phase is kept in a steady logic level, which reduces the toggle count of the selection signal Selector to prevent excessive power consumption.

Figure 8:
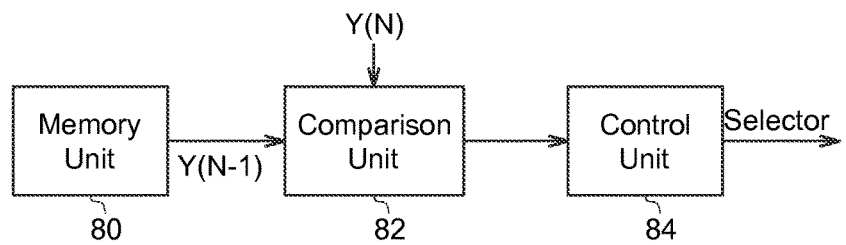
FIG. 8 shows a diagram of an external control circuit.

Because each scan line outputted from the de-multiplexer can be controlled individually, the power consumption can be further reduced by an appropriate design of the external control circuit. FIG. 8 shows a diagram of an external control circuit. The external control circuit includes a memory unit 80, a comparison unit 82, and a control unit 84. The memory unit 80 may be for example a physical memory device, for storing the previous frame Y(N−1). The comparison unit 82 compares the current frame Y(N) with the previous frame Y(N−1), The comparison unit 82 may compare each row of the image between the current frame Y(N) and the previous frame Y(N−1) to determine identical rows between the two frames. For example, if pixels in the $p^{th}$ row of the current frame Y(N) are identical to the pixels in the $p^{th}$ row of the previous frame Y(N−1), the image data does not have to be written to the $p^{th}$ row again. The control unit 84 may generate the selection signal Selector to control the de-multiplexer such that the scan line Scan(p) is kept at the cutoff voltage VGL. Thus the $p^{th}$ row of the current frame Y(N) will not be written again. Because the current leakage problem in LTPS TFT and amorphous silicon (a-Si) TFT is more serious than in IGZO TFT, image data can be stored more steadily in IGZO TFT. The control method proposed here involving comparing two image frames is especially suitable for IGZO TFT panels. For pixels that do not change between two frames, the corresponding transistor is not turned on in order to further reduce power consumption. The control circuit mentioned here may also be replaced by computer software to compute the difference between the current frame Y(N) and the previous frame Y(N−1).

As shown in FIG. 5, in the first embodiment, the rows are scanned in an interleaved manner. When the frame F01 changes to the frame F04, a human may feel uncomfortable because of the visual perception of intermediate state between the two frames. Another embodiment of a scan driver and a display panel is proposed in the following to mitigate the uncomfortable feeling encountered in human eyes.

Figure 6:
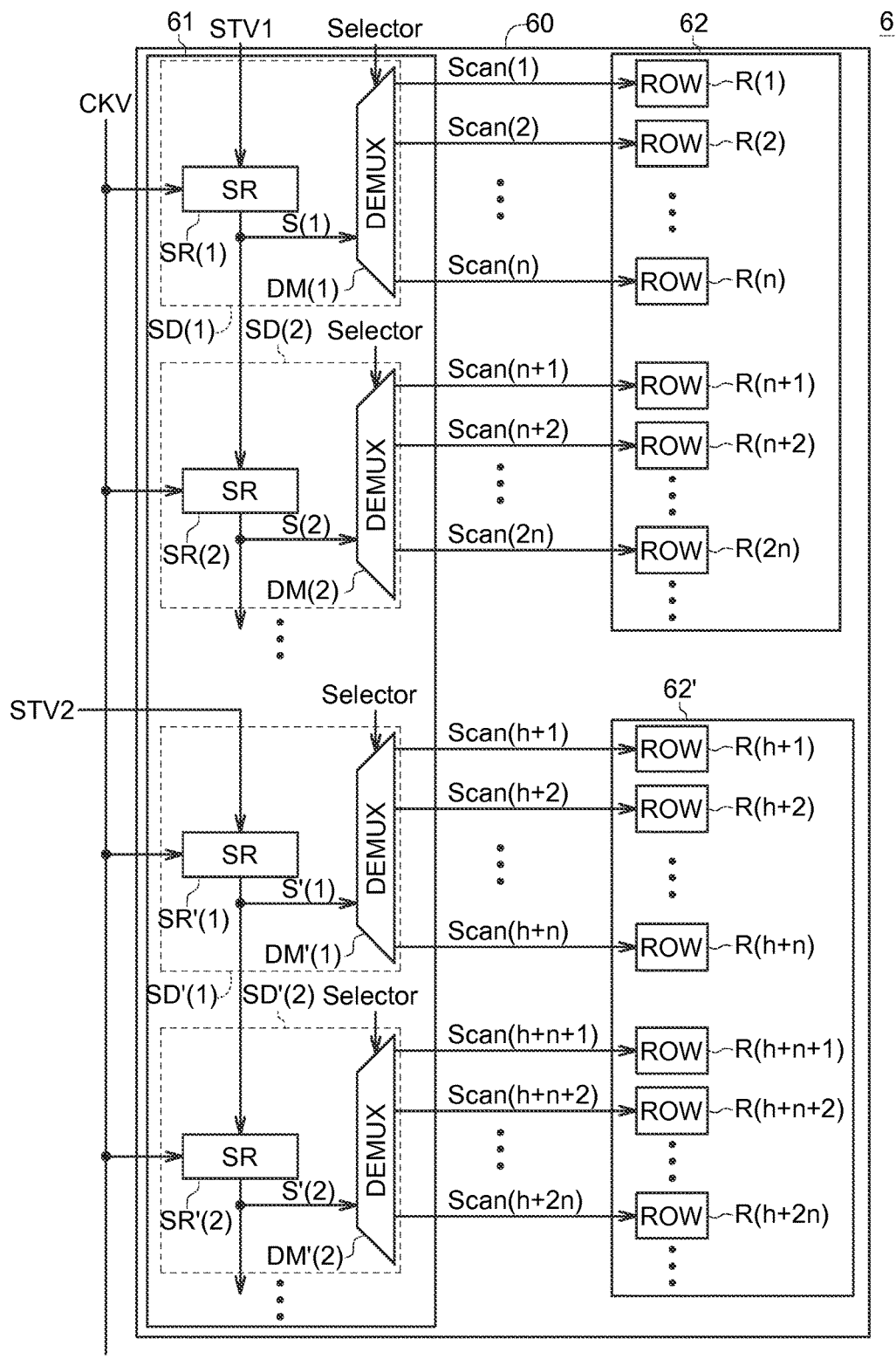
FIG. 6 shows a diagram of a display panel according to the second embodiment of the invention.

FIG. 6 shows a diagram of a display panel 6 according to the second embodiment of the invention. As compared to the display panel 2 in the first embodiment, the display panel 6 further includes a second display region 62'. The second display region 62' and the first display region 62 are formed on the TFT array substrate 60. The first display region 62 includes h first row pixel circuits R(1)-R(h). The second display region 62' includes multiple second row pixel circuits R(h+1), R(h+2), and so on. The scan driver 61 further includes multiple stages of second driving units SD'(1), SD'(2), . . . , controlled by a second start signal STV2, the clock signal CKV, and the at least one selection signal Selector. The $j^{th}$ stage of the second driving unit SD'(j) includes a shift register SR'(j) and a de-multiplexer DM'(j). The shift register SR'(j) generates a scan signal S'(j) according to the clock signal CKV and a trigger signal. The de-multiplexer DM'(j) selectively outputs the scan signal S'(j) to multiple scan lines according to the at least one selection signal Selector. Each scan line Scan(y) is configured to drive one of the second row pixel circuits R(y). The trigger signal of the $1^{st}$ stage of the second driving unit SD'(1) is the second start signal STV2, and the trigger signal of the $(j+1)^{th}$ stage of the second driving unit SD'(j+1) is the scan signal S'(j) of the $j^{th}$ stage of the second driving unit SD'(j), with j being a positive integer greater than or equal to 1.

As described above, the scan lines outputted from each de-multiplexer may be configured to drive multiple adjacent row pixel circuits. Alternatively, the scan lines outputted from each de-multiplexer may also be configured to drive multiple row pixel circuits separated by a distance. In this embodiment, the scan lines are configured to drive adjacent row pixel circuits. In addition, the first row pixel circuits R(1), R(2), . . . are disposed successively on the thin film transistor array substrate 60, and the second pixel circuits R(h+1), R(h+2), . . . are disposed successively on the thin film transistor array substrate 60 in this embodiment. The invention is not limited to this kind of layout and routing. For example, in an alternative design, the first display region 62 may include odd rows of the row pixel circuit while the second display region 62' may include even rows of the row pixel circuit. The embodiment disclosed herein is an example for easier hardware routing. That is, each of the first display region 62 and the second display region 62' represents a horizontal block of the display panel 6.

As can be seen in FIG. 6, the architecture of multiple stages of the second driving unit SD'(1), SD'(2), . . . is similar to that of multiple stages of the first driving unit SD(1), SD(2), . . . . The trigger signal of the first stage of the first driving unit SD(1) is the first start signal STV1, while the trigger signal of the first stage of the second driving unit SD'(1) is the second start signal STV2. The timing control within the first display region 62 is similar to the first embodiment and is not repeated here. After completing the scanning of the first display region 62, the second start signal STV2 is triggered to complete the scanning of the second display region 62' in a similar manner to the first display region 62.

Figure 7:
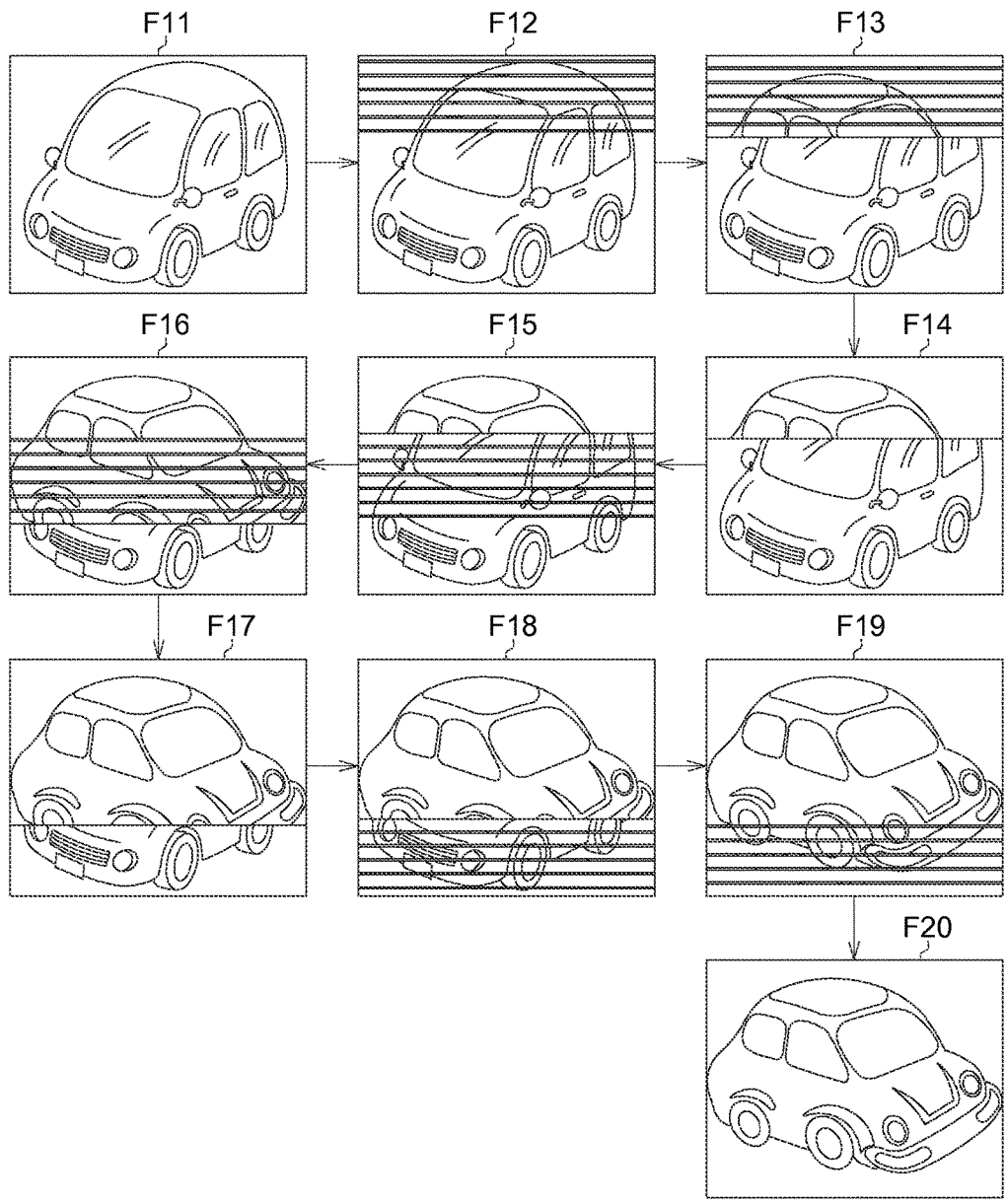
FIG. 7 shows a diagram of writing image data according to the second embodiment of the invention.

FIG. 7 shows a diagram of writing image data according to the second embodiment of the invention. The display panel 6 is divided into three display regions, such as three horizontal blocks, for a better understanding of the scanning operation. Three start signals are thus required, including the first start signal STV1, the second start signal STV2, and the third start signal STV3. Each stage of the driving unit utilizes a 1-to-3 de-multiplexer (n=3). The frame F11 is a previous frame in which a car is toward the left. The frame F20 is a current frame in which a car is toward the right. Image data is written to the three display region sequentially. At first, data is written to the top one-third of the image. Similar to the first embodiment, there are three phases and the first start signal STV1 is triggered three times. In Phase 1, the $1^{st}$, $4^{th}$, $7^{th}$, . . . rows are scanned sequentially (frame F12). In Phase 2, the $2^{nd}$, $5^{th}$, $8^{th}$, . . . rows are scanned sequentially (frame F13). In Phase 3, the $3^{rd}$, $6^{th}$, $9^{th}$, . . . rows are scanned sequentially (frame F14). Then, data is written to the middle one-third of the image. The second start signal STV2 is triggered three times. The scanning procedure may also be divided into three phases (frame F15, F16, and F17). Finally, data is written to the bottom one-third of the image. The third start signal STV3 is triggered three times. The scanning procedure may also be divided into three phases (frame F18, F19, and F20) to scan interleaved rows. The entire image frame is then updated thoroughly after the bottom one-third part has been completed.

According to the scanning method in the second embodiment, because the image is divided into multiple blocks to be scanned individually. The blur and the uncomfortable feeling caused by transition between image frames can be reduced effectively. Note that no matter what the de-multiplexing ratio (n) is, and no matter how many display regions the display panel is divided into, the time period for scanning one image frame is always the same. For a display panel with M rows, M clock cycles are required to scan one image frame. The difference lies in the order of scanning rather than the overall scan time required. Hence the scanning method in the second embodiment does not result in scanning time overhead.

In order to make the brightness of a display conform to the expected result of the driving circuit and consider the uniformity of the display panel, a compensation circuit may be adopted in a display device, especially for an organic light emitting diode (OLED) display panel. The need for compensation is due to the process variation between circuit elements, which may result in different threshold voltage levels. The current flowing through two transistors would be different even if given the same driving voltage. Different circuit magnitudes result in different display brightness. Another embodiment of a scan driver and a display panel with compensation capability is proposed in the following.

For an OLED display panel, one of the compensation methods is to apply a control signal such that the driving current of the OLED is not affected by the variation of threshold voltage. The compensation step may be divided into a reset phase, a program phase, and an emission phase.

Figure 9A:
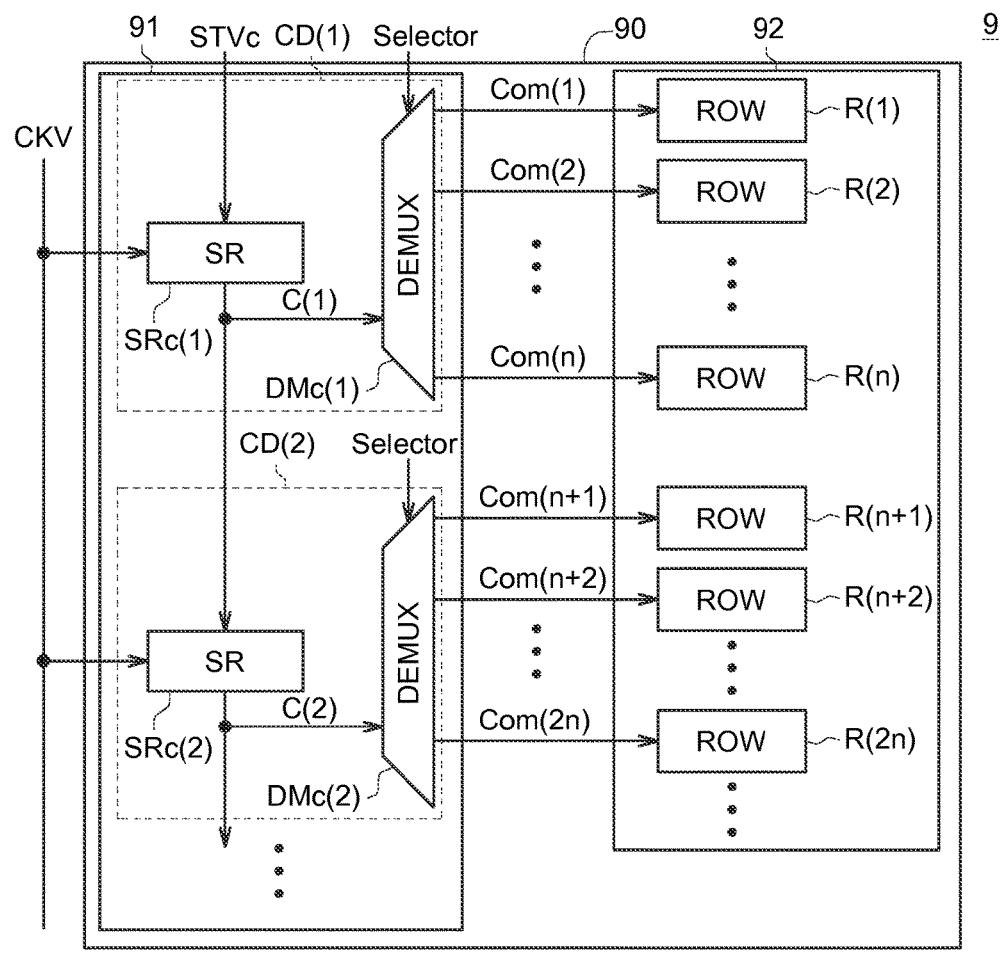
FIG. 9A shows a diagram of a display panel according to the third embodiment of the invention.

FIG. 9A shows a diagram of a display panel 9 according to the third embodiment of the invention. For a clear illustration, FIG. 9A shows only the additional part for the compensation operation as compared to the display panel 2 shown in FIG. 2. As compared to the first embodiment, the scan driver 91 further includes multiple stages of compensation driving units CD(1), CD(2), . . . , controlled by a compensation start signal STVc, the clock signal CKV, and the at least one selection signal Selector. The $k^{th}$ stage of the compensation driving unit CD(k) includes a shift register SRc(k) and a de-multiplexer DMc(k). The shift register SRc(k) generates a compensation signal C(k) according to the clock signal CKV and a trigger signal. The de-multiplexer DMc(k) selectively outputs the compensation signal C(k) to multiple compensation lines Com(n*k−n+1)-Com(n*k) according to the at least one selection signal Selector. Each compensation line Com(z) is configured to compensate one of the first row pixel circuits R(z). The trigger signal of the $1^{st}$ stage of the compensation driving unit CD(1) is the compensation start signal STVc, and the trigger signal of the $(k+1)^{th}$ stage of the compensation driving unit CD(k+1) is the compensation signal C(k) of the V' stage of the compensation driving unit CD(k), with k being a positive integer greater than or equal to 1.

The display panel 9 may be for example an OLED panel. The compensation lines Com(1), Com(2), . . . may be configured to control the reset signal RST of the row pixel circuits R(1), R(2), . . . during the reset phase, or control the emission control signal EM of the row pixel circuits R(1), R(2), . . . during the emission phase. As shown in FIG. 9A, the architecture for compensation is similar to the architecture for scan driving, a de-multiplexer is also utilized to reduce the number of shift registers required. The selection signal Selector for controlling the de-multiplexer DMc(1) of the $1^{st}$ stage of the compensation driving unit CD(1) may be the same as the selection signal for controlling the de-multiplexer DM(1) of the $1^{st}$ stage of the first driving unit SD(1). The timing control may be for example as follows: after the reset signal RST to the row pixel circuit R(1) is transmitted via the compensation line Com(1), the scan signal to the row pixel circuit R(1) is transmitted via the scan line Scan(1) such that the image data is written to the row pixel circuit R(1).

Another embodiment of a scan driver and a display panel with further reduced number of shift registers is proposed in the following. In this embodiment, multiple row pixel circuits in the display panel may share a common compensation control signal. For example, two row pixel circuits may be regarded as a single band and receive the same compensation control signal.

Figure 9B:
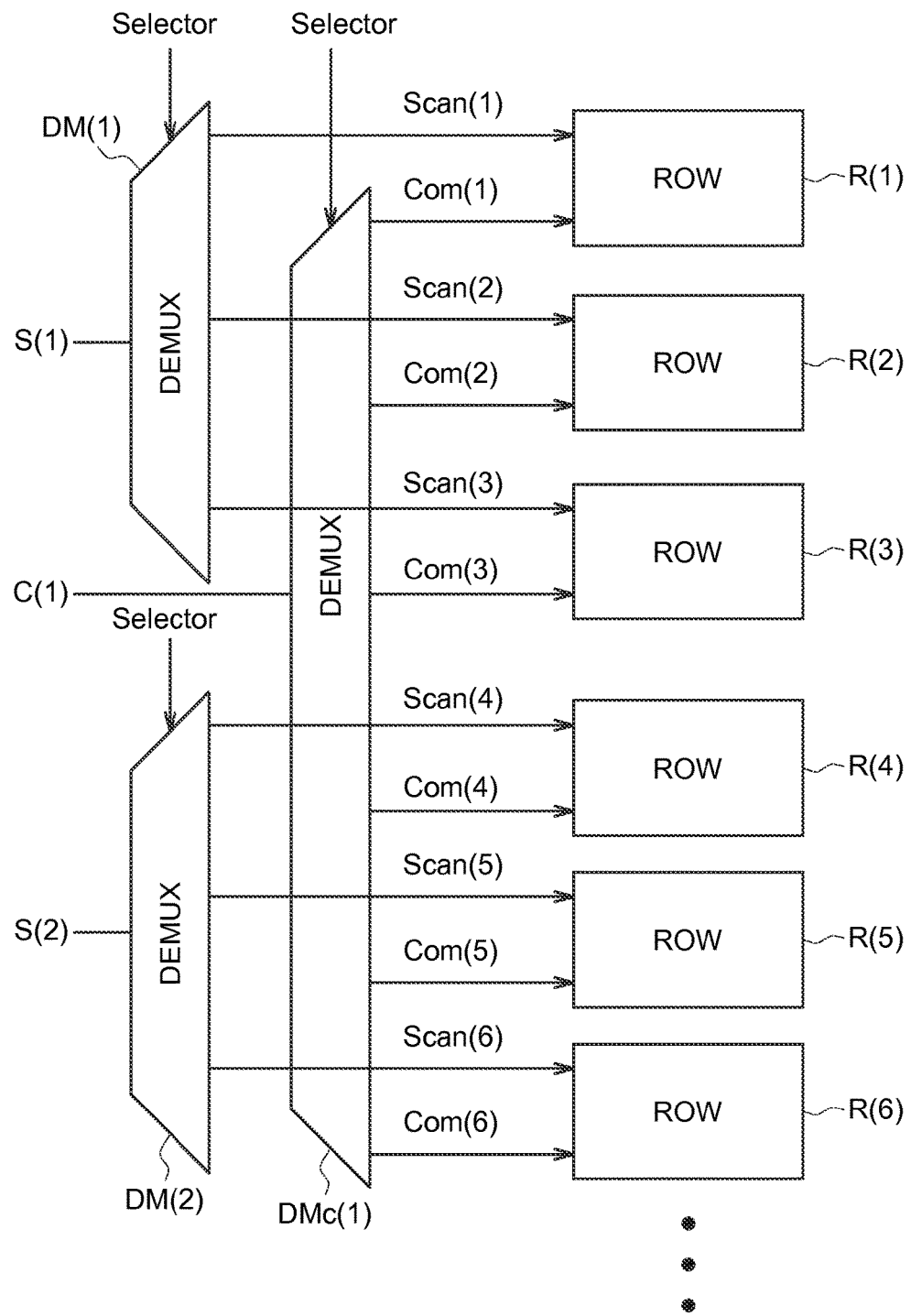
FIG. 9B shows a diagram of a display panel according to the fourth embodiment of the invention.

FIG. 9B shows a diagram of a display panel according to the fourth embodiment of the invention. In this example, 1-to-3 de-multiplexers are used, and two row pixel circuits are regarded as one band. For example, row pixel circuit R(1) and row pixel circuit R(4) are regarded as the same band. The de-multiplexer DMc(1) of the $1^{st}$ stage of the compensation driving unit CD(1) is coupled to 6 compensation lines Com(1)-Com(6). The control signal of the de-multiplexer DMc(1) is the selection signal Selector, which is the same as the control signal of the de-multiplexer DM(1) and the de-multiplexer DM(2).

FIG. 10A and FIG. 10B show diagrams of de-multiplexers in the display panel according to the fourth embodiment of the invention. The control method of the de-multiplexer DM(1) and DM(2) is similar to the first embodiment and is not repeated here. As for the de-multiplexer DMc(1), when the selection signal Sel1 is logic high, the compensation signal C(1) is outputted to the compensation lines Com(1) and Com(4). When the selection signal Sel2 is logic high, the compensation signal C(1) is outputted to the compensation lines Com(2) and Com(5). When the selection signal Sel3 is logic high, the compensation signal C(1) is outputted to the compensation lines Com(3) and Com(6).

In this embodiment, two row pixel circuits share a common compensation signal. For six row pixel circuits R(1)-R(6), two shift registers are required in the scan driving part, and only one shift register is required in the compensation part. Not only the circuit area is reduced because of the number of shift registers decreases, but also a longer compensation time is provided for each row pixel circuit because multiple row pixel circuits are compensated simultaneously. Thus a better compensation result can be achieved.

Figure 11:
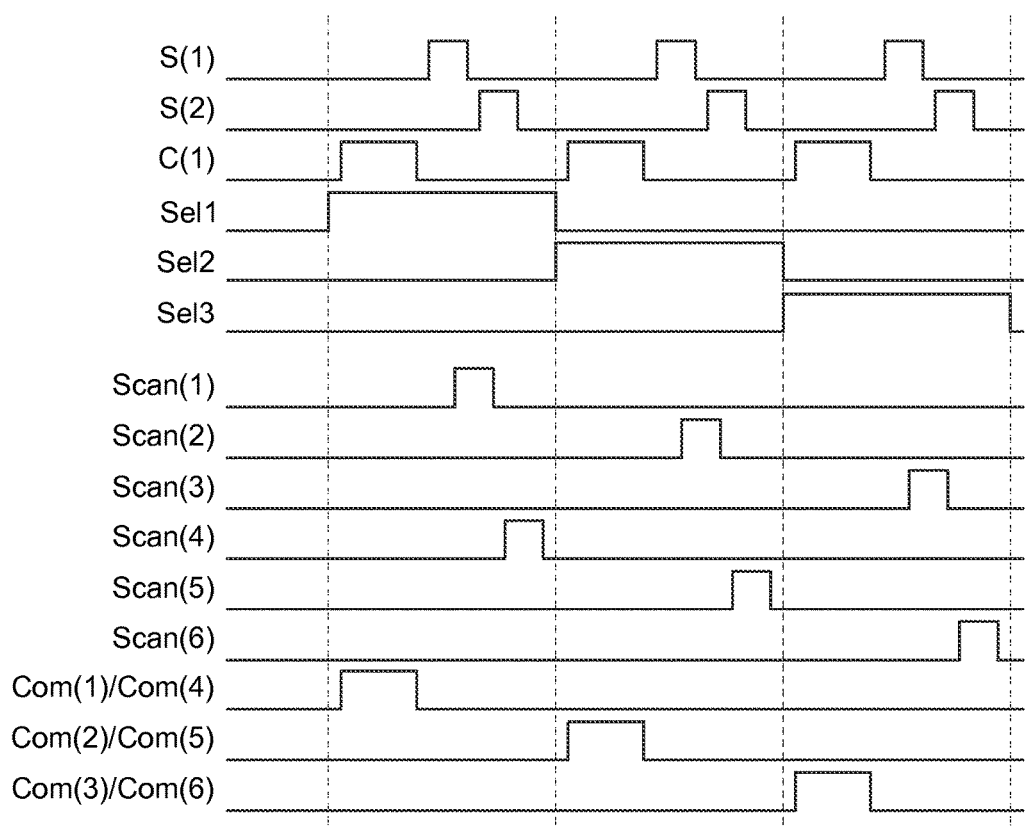
FIG. 11 shows a timing diagram regarding signals of the display panel according to the fourth embodiment of the invention.

FIG. 11 shows a timing diagram regarding signals of the display panel according to the fourth embodiment of the invention. In the example shown in FIG. 11, the compensation signal C(1) may be the reset control signal RST. During the first phase (when the selection signal Sel1 is logic high), the compensation signal C(1) is outputted to the compensation lines C(1) and C(4). After the reset, the scan signal S(1) is outputted to the scan line Scan(1), and then the scan signal S(2) is outputted to the scan line Scan(4). Thus the reset and the scan procedure of the row pixel circuits R(1) and R(4) are completed. Similarly, during the second phase (when the selection signal Sel2 is logic high), the reset and the scan procedure of the row pixel circuits R(2) and R(5) are completed. During the third phase (when the selection signal Sel3 is logic high), the reset and the scan procedure of the row pixel circuits R(3) and R(6) are completed.

In summary, the scan driver disclosed herein utilizes a de-multiplexer to selectively output one scan signal to multiple scan lines, thus the number of shift registers required can be reduced. The hardware area of the scan driver implemented by either TFTs on the panel or a gate driver IC can be reduced. The scan driver disclosed herein can be applied to a variety of display panels, especially suitable for panels with narrow bezels.

In addition, the scan driver does not increase the time required for scanning an image. Thus the frame rate is not affected. By appropriate design of connection relationship, the selection signal received by the de-multiplexer does not toggle frequently, and therefore excessive power consumption can be prevented. For TFTs with low leakage characteristic, because the pixel data can be stored effectively, a method for generating the selection signal by comparing image frames is provided, which can further reduce power consumption.

Moreover, human visual perception is also considered. A scan method and a circuit structure regarding dividing the display panel into multiple blocks are provided. Each block of the display panel is scanned sequentially. The scan driver disclosed in this embodiment not only reduces the circuit area but also provides a better user experience.

A scan driver applied to an OLED display module with compensation function is also provided in the disclosure. De-multiplexers are utilized in the compensation control circuit to reduce the number of shift registers needed. In addition, multiple row pixel circuits share a common compensation signal in order to further reduce the number of shift registers. Each row pixel circuit can also have a longer compensation time to achieve a better compensation result.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A display panel, comprising:
   a thin film transistor array substrate;
   a first display region, comprising a plurality of first row pixel circuits;
   a second display region, comprising a plurality of second row pixel circuits; and
   a scan driver, comprising:
   a plurality of stages of first driving units, controlled by a first start signal, a clock signal, and at least one selection signal, wherein each first driving unit comprises:
   a first shift register, generating a scan signal according to the clock signal and a first trigger signal; and
   a first de-multiplexer, selectively outputting the scan signal to a plurality of scan lines according to the at least one selection signal; and
   a plurality of stages of second driving units, controlled by a second start signal, the clock signal, and the at least one selection signal, wherein the second driving unit comprises:
   a second shift register, generating a scan signal according to the clock signal and a second trigger signal; and
   a second de-multiplexer, selectively outputting the scan signal to a plurality of scan lines according to the at least one selection signal;
   wherein the first trigger signal of the $1^{st}$ stage of the first driving unit is the first start signal, and the first trigger signal of the $(i+1)^{th}$ stage of the first driving unit is the scan signal of the $i^{th}$ stage of the first driving unit, with i being a positive integer greater than or equal to 1;
   wherein the second trigger signal of the $1^{st}$ stage of the second driving unit is the second start signal, and the second trigger signal of the $(j+1)^{th}$ stage of the second driving unit is the scan signal of the $j^{th}$ stage of the second driving unit, with j being a positive integer greater than or equal to 1.

2. The display panel according to claim 1, wherein for each first driving unit, the de-multiplexer selectively outputs either the scan signal or a cutoff voltage to the scan lines respectively according to the at least one selection signal.

3. The display panel according to claim 1, wherein a number of the scan lines outputted from each first driving unit is the same, and a number of the at least one selection signal is related to the number of the scan lines outputted from each first driving unit.

4. The display panel according to claim 1, wherein the scan lines outputted from each first driving unit are configured to drive adjacent first row pixel circuits in the first display region.

5. The display panel according to claim 1, wherein a number of the scan lines outputted from each second driving unit is the same, and is equal to the number of the scan lines outputted from each first driving unit, and a number of the at least one selection signal is related to the number of the scan lines outputted from each first driving unit.

6. The display panel according to claim 1, wherein the scan driver further comprises:
   a plurality of stages of compensation driving units, controlled by a compensation start signal, the clock signal, and the at least one selection signal, wherein each compensation driving unit comprises:
   a third shift register, generating a compensation signal according to the clock signal and a third trigger signal; and
   a third de-multiplexer, selectively outputting the compensation signal to a plurality of compensation lines according to the at least one selection signal;
   wherein the third trigger signal of the $1^{st}$ stage of the compensation driving unit is the compensation start signal, and the third trigger signal of the $(k+1)^{th}$ stage of the compensation driving unit is the compensation signal of the $k^{th}$ stage of the compensation driving unit, with k being a positive integer greater than or equal to 1.

7. The display panel according to claim 6, wherein each compensation line outputted from each compensation driving unit is configured to compensate one of the first row pixel circuits.

8. The display panel according to claim 6, wherein each compensation line outputted from each compensation driving unit is configured to compensate at least two of the first row pixel circuits simultaneously.

9. A scan driver, comprising:
   a plurality of stages of first driving units, controlled by a first start signal, a clock signal, and at least one selection signal, wherein at least one of the first driving units comprises:
   a shift register, generating a first scan signal according to the clock signal and a first trigger signal; and
   a de-multiplexer, selectively outputting the first scan signal to a plurality of scan lines according to the at least one selection signal; and
   a plurality of stages of compensation driving units, controlled by a compensation start signal, the clock signal, and the at least one selection signal, wherein each compensation driving unit comprises:
   a third shift register, generating a compensation signal according to the clock signal and a third trigger signal; and
   a third de-multiplexer, selectively outputting the compensation signal to a plurality of compensation lines according to the at least one selection signal;
   wherein the first trigger signal of the $1^{st}$ stage of the first driving unit is the first start signal, and the first trigger signal of the $(i+1)^{th}$ stage of the first driving unit is the scan signal of the $i^{th}$ stage of the first driving unit, with i being a positive integer greater than or equal to 1;
   wherein the third trigger signal of the $1^{st}$ stage of the compensation driving unit is the compensation start signal, and the third trigger signal of the $(k+1)^{th}$ stage of the compensation driving unit is the compensation signal of the $k^{th}$ stage of the compensation driving unit, with k being a positive integer greater than or equal to 1.

* * * * *